United States Patent [19]

Nowotarski

[11] Patent Number: 5,255,840
[45] Date of Patent: Oct. 26, 1993

[54] FLUXLESS SOLDER COATING AND JOINING

[75] Inventor: Mark S. Nowotarski, Ossining, N.Y.
[73] Assignee: Praxair Technology, Inc., Danbury, Conn.
[21] Appl. No.: 880,162
[22] Filed: May 5, 1992

Related U.S. Application Data

[62] Division of Ser. No. 456,729, Dec. 26, 1989, abandoned.
[51] Int. Cl.$^5$ ............................................. B23K 1/00
[52] U.S. Cl. .................................. 228/254; 228/256; 228/233.1; 427/123; 427/383.7
[58] Field of Search .................. 228/52, 254, 210; 427/123, 383.7, 431, 436

[56] References Cited

U.S. PATENT DOCUMENTS

| 3,373,481 | 3/1968 | Lins et al. | 228/180.2 |
|---|---|---|---|
| 3,436,818 | 4/1969 | Merrin et al. | 228/180.2 |
| 3,458,925 | 8/1969 | Napier et al. | 228/180.2 |
| 3,621,564 | 11/1971 | Tanaka et al. | 228/180.2 |
| 3,941,292 | 3/1976 | Osipov et al. | 228/52 |
| 4,273,859 | 6/1981 | Mones et al. | 228/180.2 |
| 4,821,947 | 4/1989 | Nowotarski | 228/219 |
| 4,921,157 | 5/1990 | Dishon et al. | 228/180.2 |

FOREIGN PATENT DOCUMENTS

| 84766 | 4/1988 | Japan | 228/52 |
|---|---|---|---|
| 137577 | 6/1988 | Japan | 228/52 |
| 303680 | 12/1988 | Japan | 228/256 |
| 963749 | 2/1983 | U.S.S.R. | 228/52 |
| 1459834 | 2/1989 | U.S.S.R. | 228/52 |
| 1469198 | 3/1977 | United Kingdom | 228/248 |

OTHER PUBLICATIONS

IBM Technical Disclosure Bulletin, "Selective Molten Solder Applicator for Arrays", vol. 32, No. 7, pp. 180, 181, Dec. 1989.

*Primary Examiner*—Samuel M. Heinrich
*Attorney, Agent, or Firm*—Alvin H. Fritschler

[57] ABSTRACT

An essentially fluxless soldering process enables a solder coating to be applied to a surface under controlled pressure conditions enabling the volume and shape of the solder to be desirably controlled. Coatings produced by essentially fluxless processes enable joining processes to be carried out in an essentially fluxless manner with highly desirable processing flexibility.

22 Claims, 4 Drawing Sheets

FIG. 2a
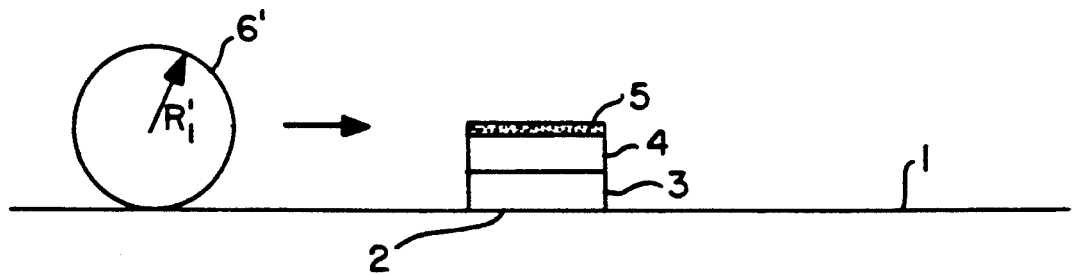
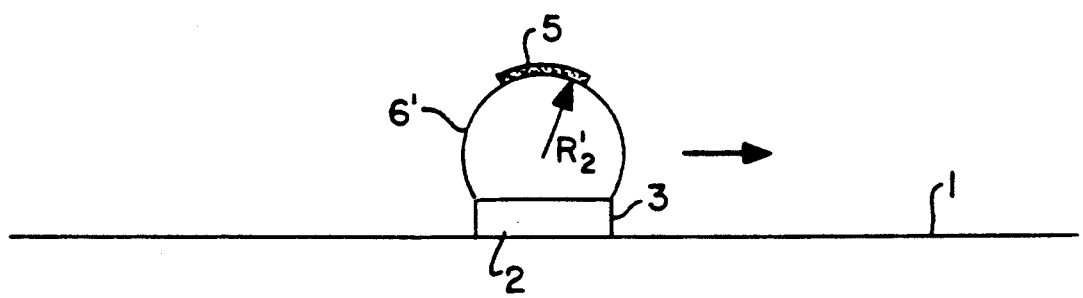
FIG. 2b
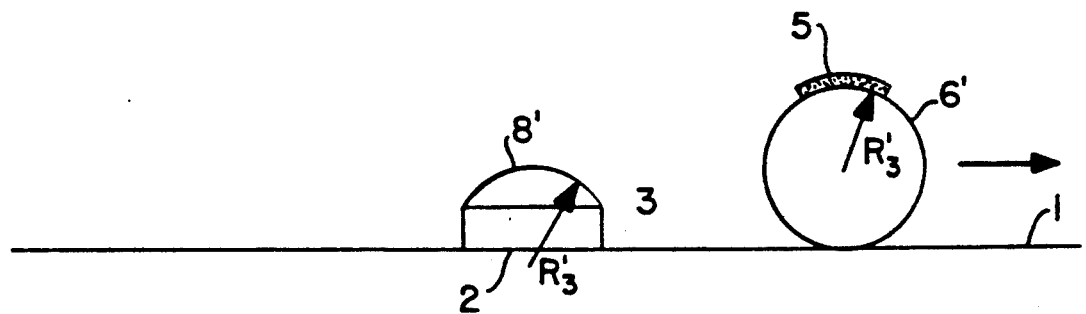
FIG. 2c ly, it relates to a fluxless solder coating and joining
FLUXLESS SOLDER COATING AND JOINING This application is a division of prior U.S. application Ser. No. 456,729 filed Dec. 26, 1989, now abandoned.

BACKGROUND OF THE INVENTION

1. Field of the Invention

The invention relates to the application of a metal-comprising coating to a metal surface. More particularly, it relates to a fluxless solder coating and joining process.

2. Description of the Prior Art

Solder joining typically is a process in which at least two metal surfaces to be joined are contacted with solder at a temperature above the melting point of the solder. To obtain good wetting and hence good bonding of the surfaces with the solder, the surfaces and the solder must be clean and free of compounds that would prevent such wetting. Such compounds that prevent wetting include, but are not limited to, oxides, chlorides, sulfides, carbonates and various organic compounds. The major impediment to wetting in most solder joining processes is an oxide coating on the solder and metal surfaces. The oxide coating typically results from the exposure of the solder and metal surfaces to air. It is necessary that such oxides and other contaminants be reduced to their metal form, reacted to form other compounds not detrimental to wetting, or removed by known means such as dissolution or mechanical cleaning, to assure good wetting.

Compounds detrimental to wetting are commonly reacted or dissolved and washed away by the use of a fluxing agent. Fluxing agents, however, are typically corrosive, and necessitate the removal residues thereof after the soldering process. The cleaning processes used to remove the flux residues are expensive and difficult to control. In addition, the most commonly used cleaning agent, CFC 113, has been shown to destroy ozone in the stratsophere. This presents a serious environmental problem, and most industrial nations have agreed, under the so-called Montreal protocol, to eliminate the production of this cleaning agent. All of the proposed alternatives to CFC 113 are either more expensive, not as effective, not as safe to use, or require the purchase of new cleaning equipment.

For such reasons, it is often desirable to employ a fluxless solder coating and joining process. If no flux is used, then no cleaning is required. In the Nowotarski patent, U.S. Pat. No. 4,821,947, such a process for fluxless coating and joining with solder is disclosed. In this process, solderable metal surfaces are contacted with an inert molten metal bath. While a flux must be used in conventional soldering in air in order to dissolve oxides and contamination from the solder bath and the solderable surface, the need for a flux is eliminated in the Nowotarski process by inerting the solder bath and surface, with the inert bath being oxide free. Contamination on the solderable surface is pulled away by the surface tension of the inert solder bath. This desirable action is enhanced if there is a coating on the solderable surface that is a liquid at soldering temperatures. The contamination that forms on the surface of the coating is then more easily pulled away from the solderable surface. A very common and effective protective coating is electroplated solder.

While the Nowotarski process represents a desirable advance in the art, it is nevertheless difficult with this process to control the amount of solder left on the solderable surface or joint after the solderable surface has detached from the solder bath. For example, if an electronic circuit board with a conductor pad were lowered into a solder bath under an inert atmosphere, with the conductor pad having an electroplated solder coating that is contaminated with solder oxides and dirt, the electroplated solder coating would melt and solder surface tension would pull the oxides and dirt away. The solder in the solder bath would then effectively wet the conductor pad. Upon pulling the circuit board away from the solder bath, however, the solder surface tension at the conductor pad would cause solder to be pulled up and cling to the conductor pad. The pressure inside the solder column would drop as the pulling away of the circuit board from the solder bath is continued, and the solder column would neck in and eventually break at the so-called point of departure. The solder above the point of departure would stay with the conductor pad, and the solder below would fall back into the solder bath.

The exact point at which the solder breaks would depend on many factors, including the circuit board withdrawal speed, the slope of the conductor pad, the surface tension of the solder and the like. It is very difficult to control all of these parameters so as to determine the final solder volume and shape in the coating. Consequently, the amount of solder in this and in other such applications will be found to vary considerably. This high degree of sensitivity of the coating process to various operating parameters is a reflection of the fact that the solder separation process is very non-equilibrium. The pressure inside the column of solder changes suddenly from negative to positive when the solder column breaks.

While significant advances have been made in the soldering art, it will be appreciated that further improvements are desired to enhance the feasibility and acceptance of soldering without flux for a variety of practical commercial applications. Thus, the ability to control the final solder volume and shape would be of major benefit in the art. This would enable a desirable reproducibility and quality control to be achieved in such commercial applications.

It is an object of the invention, therefore, to provide an improved solder coating and joining process, and an improved solder coating and joint.

It is another object of the invention to provide a solder coating process in which the final solder volume and shape can be controlled.

It is a further object of the invention to provide a fluxless or nearly fluxless process for solder coating and joining with a controlled solder volume and shape.

With these and other objects in mind, the invention is hereinafter described in detail, the novel features thereof being particularly pointed out in the appended claims.

SUMMARY OF THE INVENTION

The pressure inside a fluxless or nearly fluxless solder coating/joint is controlled in order to control the final solder volume and shape. The solderable surface is thus brought into contact with a solder reservoir at a controlled pressure and is detached under controlled pressure conditions.

BRIEF DESCRIPTION OF THE DRAWINGS

The invention is further described herein with respect to the accompanying drawings in which:

FIGS. 2a, 2b, and 2c are illustrations of an embodiment of the invention utilizing a relatively small solder ball reservoir;

DETAILED DESCRIPTION OF THE INVENTION

The amount of solder in a coating or joint is controlled very precisely by bringing a solderable surface or surfaces into contact with a solder reservoir and the detaching said surface therefrom, with the internal pressure of the reservoir being controlled relative to ambient pressure at the point of departure. It is found that there is a direct relationship between the shape of a solder surface in the final solder coating or joint and its internal pressure. By controlling the pressure in a solder coating and then separating it from the solder reservoir at said pressure, the process is carried out much closer to equilibrium conditions and is much less sensitive to operating parameters than is the prior art fluxless coating process discussed above.

In the practice of the fluxless solder coating embodiments of the invention, the solderable surface is contacted, under inert, fluxless conditions, with a solder reservoir and is then detached therefrom, with the pressure of the coating at the point of departure being about the same as the pressure of the solder in the reservoir at the point of departure, after as well as before separation at said point of departure. In this manner, the final solder volume and shape can be carefully controlled by adjustment of said pressure of the coating at the point of departure of the coating from the solder reservoir.

Figure 1A:
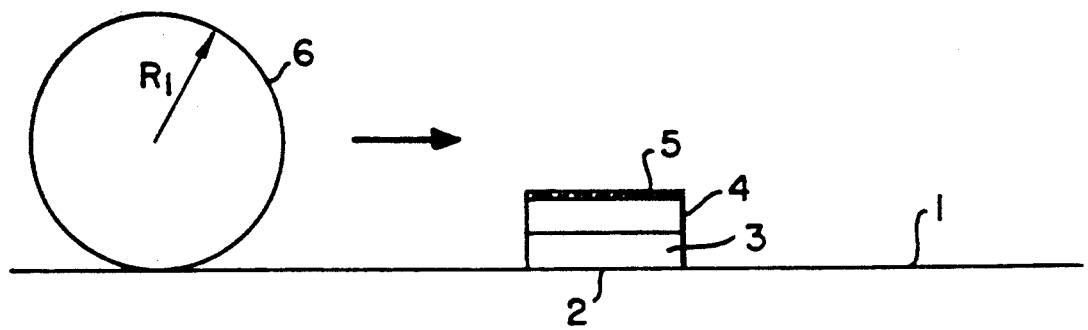
FIGS. 1a, 1b, and 1c are a schematic drawing illustrations of an embodiment of the invention utilizing a relatively large solder ball reservoir.
Figure 1B:
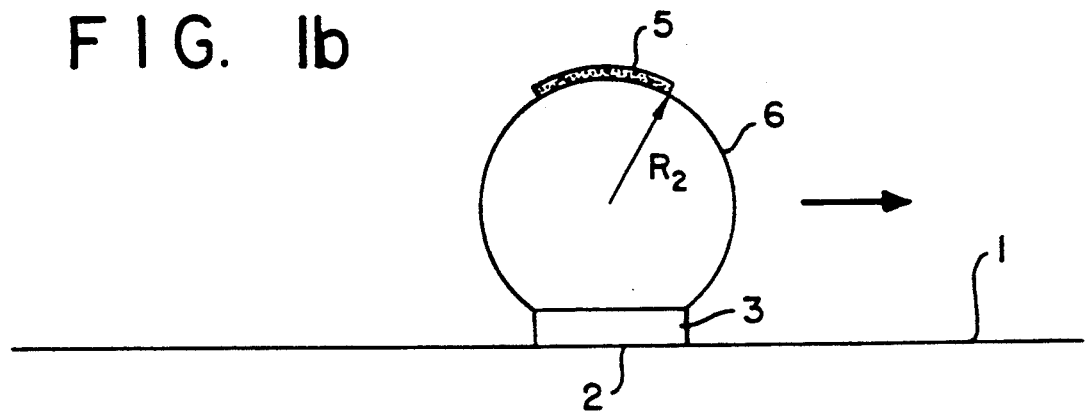
Figure 1C:
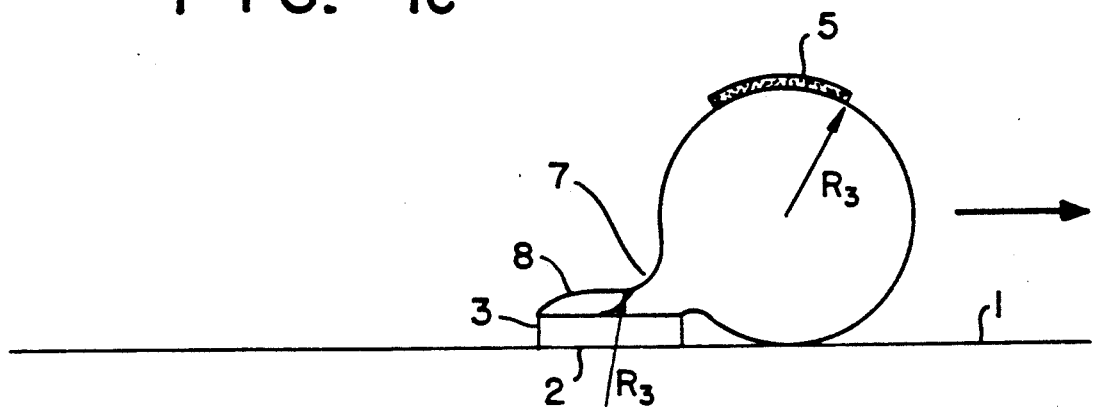

With reference to the FIG. 1 embodiment, a circuit board represented by the numeral 1 has a conductor pad 2 positioned thereon. Prior to soldering, pad 2 comprises a copper base metal pad 3 having an electroplated solder coat 4 thereon. Oxide and other undesired contaminants 5 are present on solder coat 4. The solder reservoir is shown in the form of a relatively large solder ball 6, having a radius of curvature $R_1$, that is moving on the surface of circuit board 1 in the direction of conductor pad 2. The environment of the solder ball and the conductor pad is inert. Upon contact of conductor pad 2 with solder ball 6, solder coat 4 will melt and form part of said solder ball 6. Said solder ball 6 will tend to flatten slightly across conductor pad 2, assuming a radius of curvature $R_2$. The oxide and contaminant coating 5 will be seen to adhere to solder ball 6 and to be stripped from the base metal 3 of conductor pad 2, with a sufficient amount thereof being removed to leave some bare, oxide free regions on the conductor pad. Upon solder ball 6 thereafter moving off of base metal 3, solder ball 6 shall then have a radius of curvature $R_3$, and a point of departure 7 will form between said solder reservoir ball 6 and the coating 8 remaining on base metal 3. Under such circumstances, the pressure in coating 8 will be nearly the same as in solder ball 6 at the point of departure, and coating 8 will assume a shape having a radius of curvature essentially equal to $R_3$. Upon separation at point of departure 7, the coating pressure will remain nearly the same as in solder ball 6, and coating 8 will have a controlled volume and shape with its width being that of base metal 3 and its height and curvature being such that the radius of curvature is approximately $R_3$.

The FIG. 1 embodiment has been used to place a clean, oxide free solder coating on a copper pad 3 without the use of flux, and with the desired radius of curvature of the final coating being about 1.5 mm. The pad was previously coated with an electroplated solder coating 4 that was oxidized and contaminated by handling. The pad had a disc shape with a radius of 0.85 mm, attached to a fiberglass circuit board. An inert environment of nitrogen, with less than 300 ppm oxygen, was employed at a temperature of 420°–430° F. The solder was an alloy of 60 wt. % tin, 38 wt. % lead and 2 wt. % antimony, having a melting point of about 390° F.

The oxide free solder ball 6, used as the solder reservoir for coating pad 3, was generated using a glass dropper filled with solder. A drop of solder was squeezed out of the dropper into the nitrogen environment and fell onto the circuit board. The radius of curvature of solder ball 6 was about 1.5 mm. The positive radius of curvature of the solder ball kept the pressure positive inside the ball. It will be understood that the radius of the ball can be varied by varying the diameter of the dropper, with smaller diameters making smaller solder balls. Upon contacting solder ball 6 with pad 3 and removing said ball from contact with pad 3, a coating having the desired radius of curvature of about 1.5 mm was formed.

It should be noted that the pressure change across the surface of a sphere is given by:

Pressure inside − Pressure outside = surface tension*2/R, where R is the radius of curvature of the sphere.

For non-spherical shapes, the pressure across the surface is given by:

Pressure inside − Pressure outside = surface tension*(1/r1 + 1/r2), where r1 is the radius of curvature of the surface in one plane, and r2 is the radius of curvature in a plane normal to the first. For purposes of this disclosure, if a surface is non-spherical, the term "radius" will be construed to mean $$2 / \left( \frac{1}{r1} + \frac{1}{r2} \right).$$

r1 and r2 can be positive or negative. If a radius of curvature is inside a body of solder, as in solder ball 6, the pressure is positive. If it is outside the solder, it is negative. In the prior art embodiment in which the conductor pad is pulled upward out of a body of solder into which it has been dipped, the column of solder that necks in has an outer radius of curvature, i.e. r1, that is outside of the solder column, and an inner radius of curvature, i.e. r2, inside the necked in portion of solder. In such circumstances, r1 is negative, and r2 is positive. Since it is found that r1 is actually smaller than r2, the pressure inside the solder at the point of departure and the radius of curvature of the surface are negative.

For a sphere, the radius of curvature is equal everywhere, and the pressure is equal everywhere. If a sphere is large enough, however, gravity effects become important, and the pressure at the top is less than the pressure at the bottom. The sphere then flattens out into a so-called "sessile drop". This does not affect the invention, however, since it is only concerned with the pressure at the point of departure. Thus, the fact that the pressure may be different elsewhere within the solder reservoir or the coating is not important.

As shown at the bottom of FIG. 1, solder can flow freely between the solder reservoir ball 6 and pad coating 8 at point of departure 7. As a result, the pressure equilibrates on both sides of the point of departure. The radius of curvature of the pad coating is, therefore, the same as that of the solder reservoir ball. To obtain a thicker coating, the radius of curvature would be made smaller, and a smaller solder reservoir ball would be employed. This is shown in FIG. 2, in which the same materials are employed as in FIG. 1. It will be noted that a smaller solder reservoir ball 6', having a smaller R' than in the FIG. 1 embodiment, is employed, and that coating 8' is thicker than coating 8 of the FIG. 1 embodiment. The radius of curvature $R'_3$ of coating 8 is essentially the same as $R'_3$ of solder reservoir ball 6'.

There is no limit as to how small the radius of curvature should be for the solder ball of the invention. For the conductor pad, however, the radius of curvature of the final coating should not be less than about ½ the minimum distance across the pad. Very small solder balls relative to the conductor pads will thus not be effective for the coating purposes of the invention. They will be absorbed into the coating.

The controlled pressure process of the invention has been practiced with the coating of about 30 conductor pads with the same ball of solder. Each had a clean, oxide free coating with the same radius of curvature and solder volume after being coated. If a very large number of pads are coated by a single ball, however, the oxides from the cleaned pads will eventually cover the solder ball, and it will no longer retain its spherical shape. At this point, it will not leave uniform coatings on the pads, and small amounts of solder oxide may become stuck to the circuit board. The solder ball should then be disposed of, and a fresh solder ball employed for the coating of additional pads.

Those skilled in the art will appreciate that various changes and modifications can be made in the details of the invention as disclosed and claimed herein. While the invention is described herein particularly with respect to coating processes referred to generally as solder processes, those skilled in the art will appreciate that the practice of the invention pertains to any process in which a molten metal is to be coated onto and joined with a solid metal having a higher melting point than that of said molten metal. For example, coating processes normally described as brazing, where the molten metal has a melting point above 840° F., are also included within the scope of the invention as herein described and claimed. The soldering processes referred to herein shall be understood to include electronic soldering, where a tin-based filler metal, having a melting point range of 180°-320° C., is employed. The inert environment in which the controlled pressure coating process is carried out shall be understood to comprise an environment that does not form a continuous oxide or other solid metal salt compound on the solder reservoir ball or other molten metal surface or on the conductor pad surface during the soldering or other coating operation. A solder surface is considered oxide free for purposes of the invention if there is not a continuous oxide coating on the surface of the solder. Some islands of oxide can thus be tolerated in the practice of the invention.

The invention includes within its scope both fluxless and nearly fluxless coating. A flux is understood to mean a material that is a liquid at the solder bath temperature and which dissolves compounds determined to wetting, e.g. oxides, or which reacts chemically with compounds detrimental to wetting so that they become liquids or gases that are easily removed. Fluxless coating denotes that there are no measurable amounts of flux in contact with the conductor pad and solder at the time of coating the solder on the pad. Nearly fluxless coating denotes that the total amount of flux on a circuit board never exceeds 3 micrograms NaCl equivalent per $cm^2$ of circuit board. This level of flux is considered clean in the art. Essentially fluxless coating, as recited in the claims, shall be understood to include either fluxless or nearly fluxless coating.

In the illustrative example, the 1.5 mm diameter solder ball was brought into contact with the conductor pad, and the surface tension of the oxide free solder ball pulled the oxide and contamination off of the pad. When the solder ball was then pushed away from the conductor pad, it took most of the oxide with it. In particular embodiments of the invention, the oxide coated solder ball is cleaned by contacting it with a very small quantity of flux Both abietic acid (rosin) and adipic acid (COOH—(CH$_2$)$_4$—COOH) are suitable for this purpose, being common organic acid fluxes. Ideally, the flux used to regenerate a solder ball should not come into contact with the circuit board. Even if it does, however, the amounts of flux residue would be so small as not to be a problem in typical soldering applications.

As indicated above and in accordance with U.S. mil spec MIL-P-28 809, a circuit board is considered clean if the ionic contamination is less than 3.1 microgram NaCl equivalent for 1 $cm^2$ of circuit board area. This is measured by washing a circuit board in an ionic free solution of water and alcohol and measuring the electrical conductivity of the wash solution as it picks up ions from the circuit board. In this regard, it shall be noted that a solder ball fully loaded with oxide might have a tin oxide (SnO) layer thickness of 2 nm (nanometer). If this oxide were converted to an ionic residue by a flux, it would then be equivalent to 1.12 microgram NaCl per $cm^2$ of solder ball area. Even if all of this residue were deposited directly on the circuit board, it would still be well below the level that would be considered contaminated by said mil spec.

In the illustrative example above, the solder ball is moved on the surface of the circuit board in the direction of the conductor pad for contact therewith. The solder ball can be pushed, as with a glass plate, or can be pulled, as with a soldering iron. In addition to such solder ball moving techniques, it may, in some applications, be convenient to utilize a screen to push a number of solder balls across the circuit at one time. Another approach would be the use of an array of pins, each with a solder ball attached thereto. The pins could be raised or lowered as the solder balls were dragged across the solder board to avoid soldering conductor pads thereon that were not intended to be soldered at that time. If different pins or rows of pins had different size solder balls, they could be raised and lowered to give different conductor pads different solder coating thicknesses as herein provided.

It is a common practice in the art to pull a solder ball across a circuit board to coat small conductor pads positioned thereon, using a soldering iron in an air environment. A flux is employed to achieve proper wetting, with about 1 to 4 wt. % flux, based on the weight of solder, typically being employed. By contrast, in the practice of the invention, an inert atmosphere is employed during such coating, and wetting is achieved even in a fluxless process or in a nearly fluxless process in which the amount of flux is reduced to the very low level indicated above. Such low level of flux does not necessitate the cleaning of residues, as in conventional practice of using a flux in an air environment.

The coating process of the invention, not only in its no flux embodiment, but in those employing the indicated very tiny amounts of flux, achieves a surprisingly significant benefit in terms of keeping the solder ball oxide free, retaining its spherical shape and wetting conductor pads. The process enables the solder volume to be desirably controlled in fluxless coating operations in a manner not obtainable in the process in which the conductor pad is immersed in a solder bath. In one current soldering practice known as reflow soldering, the amount of solder in a joint is typically controlled by printing a solder paste and flux on the conductor pads. This is a very difficult process to control since the ability to print is strongly affected by the paste properties, which, in turn, change considerably with temperature, age, humidity and the like. Solder preforms are also used in some cases, but each pad geometry must have its own shape, and the pads require flux to remove the oxides formed on the preforms.

In addition to desirable control of the amount and shape of the solder coatings, the invention enables essentially fluxless coating and joining to be achieved without contact or immersion of the solderable surfaces with a larger solder bath, which can be impractical from an operating viewpoint and can cause damage to substrates and components. The invention also allows for a variety of essentially fluxless joining processes, providing a very important benefit of the controlled pressure process herein described and claimed.

The invention has been described above particularly with respect to the use of a solder ball to obtain a controlled positive pressure at the point of departure between the metal to be coated or joined and the solder reservoir. It should be noted that other means can also be used to obtain such a controlled positive pressure. For example, a syringe method can be used for this purpose. A syringe, typically having a glass body and a stainless steel needle, can be used to deposit molten metal on the conductor pad or other surface to be coated under said controlled pressure conditions. For this purpose, the body of molten metal in the syringe can be placed under a desired positive pressure so that a controlled volume and shape of molten metal will be deposited therefrom onto the surface to be coated. Alternatively, the syringe may be used so that the force of gravity of the molten metal therein establishes the desired controlled positive pressure at or near the final desired pressure at the point of departure.

It will be appreciated from the above that the controlled pressure approach of the invention differs significantly from the prior art approach wherein the part to be coated is withdrawn from a solder bath. In the latter approach, the pressure at the point of departure changes abruptly from a negative to a positive pressure at the time the solder column breaks. As the particular negative pressure value will depend, as indicated above, upon the operating parameters relating to a particular application, the pressure at the point of departure will be uncontrolled and will not necessarily be the desired pressure to produce a desired volume and shape of the final coating.

Those skilled in the art will appreciate that the desired controlled pressure at the point of departure may be negative as well as positive. While controlled positive pressures are preferred in applications in which a convex coating surface is desired, the use of controlled negative pressures are preferred when a concave shaped coating is desirable. In such instances, it is convenient to apply coating material to the surface to be coated under positive pressure conditions and to change to controlled negative pressure conditions at the point of departure before separation of the coating from the reservoir of molten metal. A syringe can be used to first apply the positive pressure to wet the component, and then the controlled negative pressure during the time of separation to insure the proper coating shape. The use of a controlled negative pressure is generally preferred over a controlled positive pressure in applications in which an L-shaped conduction pad is employed. Such a coating configuration may be desirable, for example, in applications in which the coating provides a socket for a lead-less chip carrier or the like. The use of a controlled negative pressure is also commonly preferred when a joint is being made between two objects. Concave joints (negative internal pressure) tend to have better mechanical properties than convex ones.

Figure 3:
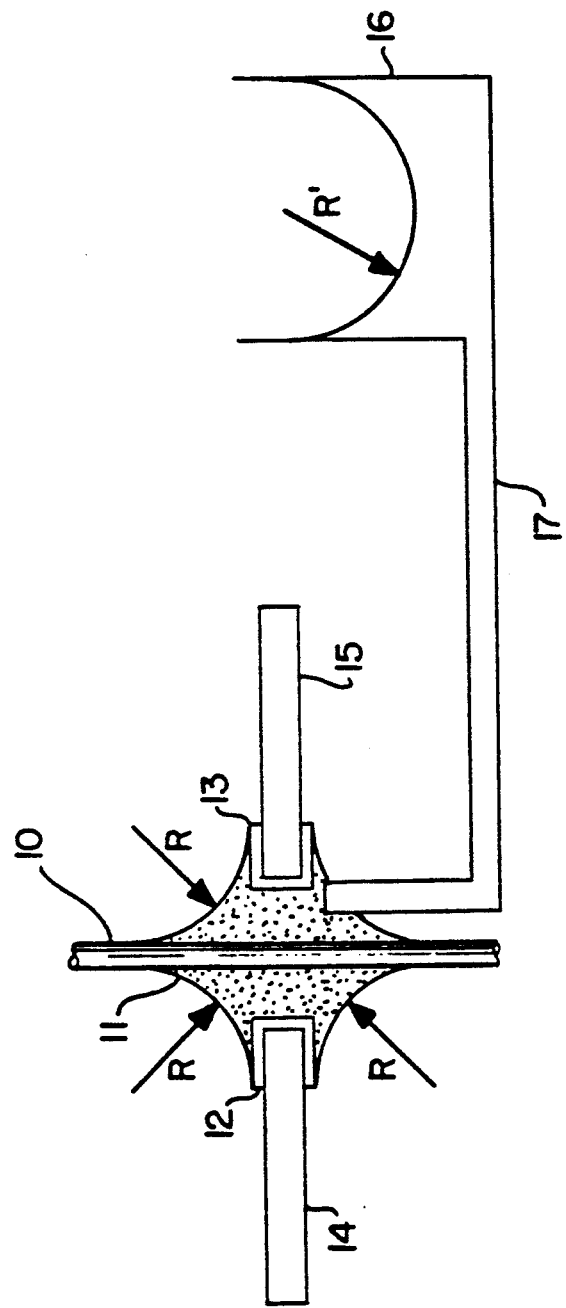
FIG. 3 is a schematic drawing illustrating the formation of solder joints under controlled negative pressure conditions.

FIG. 3 of the drawings is provided to illustrate the cross section of a typical solder joint between a lead and a circuit board using the controlled negative pressure embodiments of the invention referred to above. Lead 10 is soldered by solder joint 11 to conductor pad 12, conductor pad 13 of circuit boards 14 and 15, respectively. Solder joint 11 is contacted with solder reservoir 16 through conduit 17. Solder joint 11 has a controlled negative pressure inside thereof as evidenced by the fact that the radii of curvatures, R, lie outside the solder. Such negative radii of curvature are controlled by bringing the solder joint in contact with a reservoir of solder having a negative controlled pressure condition, as contrasted to the positive controlled pressure condition pertaining with respect to the solder ball and other positive pressure embodiments of the invention. In the illustrated embodiment, the negative controlled pressure in the reservoir results from the wetting of the sides of the reservoir by the solder. The meniscus is concave, the radius of curvature $R'$ lies outside the solder, and hence the pressure of the reservoir is negative. By bringing solder joint 11 on the circuit boards in contact with controlled negative pressure reservoir 16, the joint will have the same negative pressure inside and the desired concave shape. This joining approach has the advantage of eliminating the undesired bridges that form when joints contain too much solder, and the excess solder extends to and wets adjacent joints on the circuit board.

The essentially fluxless coating process of the invention, and that disclosed in the Nowotarski patent referred to above, both yield solder coatings which are extremely solderable. As used herein, essentially fluxless will be understood to include fluxless and nearly fluxless conditions as described above. It has been discovered that, in fact, they are so solderable that they will join together, essentially without flux, even in an air environment. In preferred embodiments, however, both surfaces to be joined have molten solder coatings and are joined in an inert atmosphere.

Figure 4A:
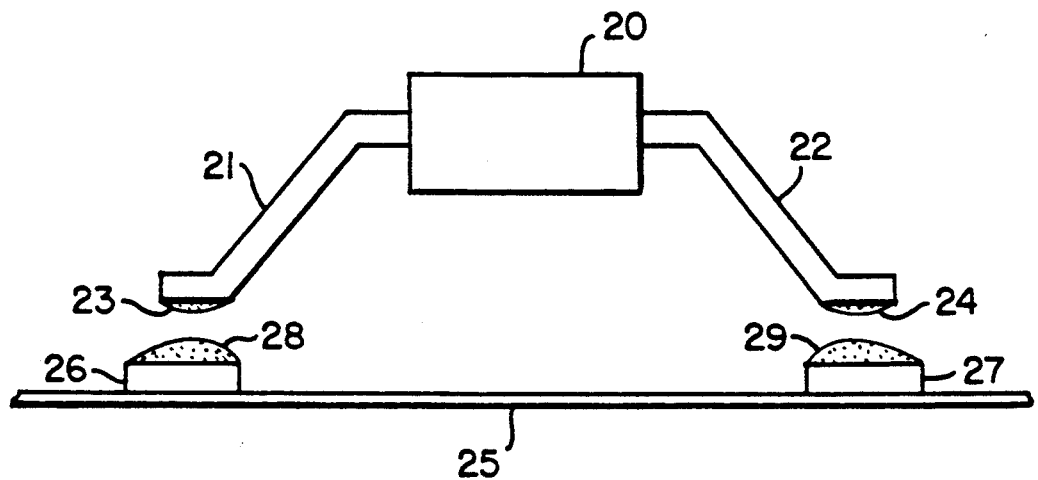
FIGS. 4a and 4b are schematic drawings illustrating the fluxless attachment of previously coated surfaces.
Figure 4B:
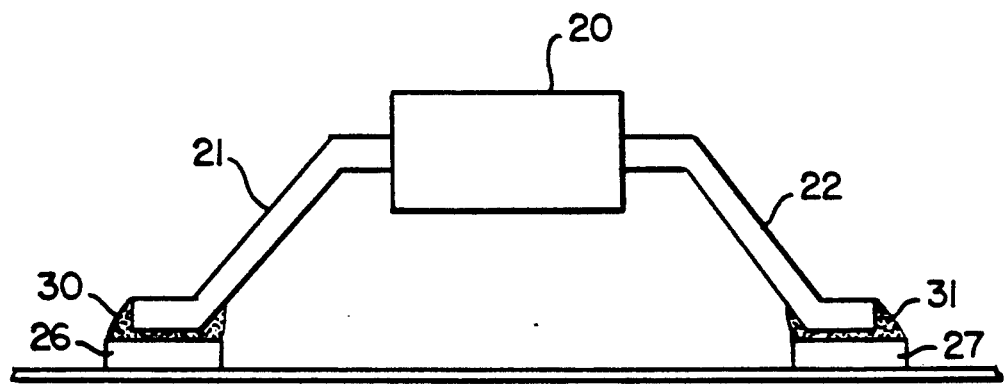

The process of solder joining, wherein two surfaces to be joined are contacted with solder for the desired joint at a temperature above the solder melting point, is distinguished from wave or dip soldering wherein the surfaces to be joined are brought into contact with a reservoir of solder, and the joint "soaks up" or retains that solder it needs as it is removed from the wave of solder. As illustrated in FIG. 4, a component 20 has leads 21 and 22 upon which convex solder coatings 23 and 24 are applied. A circuit board 25 has conductor pads 26 and 27 upon which solder coatings 28 and 29 are applied. Upon contacting solder coatings 23 and 28, and solder coatings 24 and 29 at a temperature above the solder melting point, solder joints 30 and 31 are formed to thereby secure component 20 to circuit board 25.

For joining using a solder coating applied in accordance with the controlled pressure process of the invention, at least one of the surfaces of the joint will have a coating thus applied in accordance with the invention. As indicated above, the discovery of the desirable essentially fluxless joining based on the coating process of the invention has led to the further discovery that a suitable fluxless joining operation can be carried out when at least one of the surfaces of the joint is coated in accordance with the fluxless process of said Nowotarski patent. In preferred embodiments, at least two surfaces to be joined are coated by essentially fluxless processes, with the conductor pads most preferably coated using the controlled pressure process of the invention to ensure an adequate and desired amount of solder in the joint. The surfaces are preferably joined above the solder melting point in an inert atmosphere. The joints are immediately and consistently formed when the solder is molten prior to contact. The position of the parts can be conveniently adjusted without stripping solder off of the conductor pads, as solder surface tension will help ensure that the parts are positioned properly. This effect can be enhanced by vibrating the board or component slightly. As a result, component placement accuracy is much less critical than when components are placed in a solder paste, e.g. small solder balls in a flux binder, or a preform, e.g. solid pieces of solder instead of paste. Using the joining process of the invention, fine pitch components, having lead spacing of less than 20 thousandths of an inch, can be placed manually, whereas in conventional practice, a pick and place machine or a robot with machine vision is required for such placement.

In a significant feature of the invention, it has been found that the coating surfaces to be joined can be coated and exposed to air, but still effectively be joined upon subsequent reheating in nitrogen. As a result, it is possible to carry out the coating at one location, and the subsequent joining at another location.

It is also within the scope of the invention to assemble the parts to be joined while the coatings are solid, and then apply heat in an inert atmosphere to make the joints. This is not particularly preferred since this joining process is difficult to carry out in practical commercial operations since a slight jostle will tend to move the components. This operating difficulty can be overcome, however, by the use of suitable fixtures or glue.

It has been found, surprisingly, that the parts to be joined can be assembled in air if the coatings are in molten state. This is an unexpected circumstance since a continuous oxidation of the coating surfaces would occur prior to joining if the coatings are exposed to air. It appears that the surface tension of the solder is strong enough to crumple the oxide coating provided the time of exposure of the coatings to air is sufficiently short so that the continuous oxide layer is relatively thin. Exposures of molten coatings to air for as long as 30 seconds prior to joining have occurred without adverse effect on the subsequent joint. Longer exposures can also be tolerated so long as good joints are nevertheless formed.

While a joint can be obtained if both surfaces are coated by the process of said Nowotarski patent, it will be appreciated that the amount of solder in the joints will vary and may not be adequate for a proper joint.

It is within the scope of the invention to carry out the joining with only one surface coated by the controlled pressure process of the invention or by the process of the Nowotarski patent. In this case, the joining has to be carried out in an inert atmosphere, e.g. nitrogen atmosphere, and the other, non-coated surface has to be solderable, i.e. wettable by the solder employed.

The application of a controlled volume of solder to a solderable material in an essentially fluxless application represents a highly desirable advance in the soldering art. Such coating using the controlled pressure process of the invention, and the fluxless joining techniques derived therefrom, enable higher quality, more reproducible joints to be produced. Such enhanced quality and the processing flexibility provided in the practice of the invention enable soldering operations to be more fully responsive to the growing needs of a variety of industrial applications.

I claim:

1. An improved process in which a molten metal is to be coated onto at least one solid metal surface having a higher melting point than that of said molten metal, comprising:
   (a) contacting at least one solid metal surface to be coated with a reservoir of said molten metal under inert, essentially fluxless conditions, so as to establish a controlled pressure across the surface of the coating of molten metal and the surface of said reservoir of molten metal essentially at a desired final pressure of said molten metal coating; and
   (b) removing said reservoir from contact with the solid metal surface, a point of departure being formed between the reservoir and the metal coating remaining on the solid metal surface, the pressure of the molten metal in the coating being essentially the same as the pressure within the reservoir of molten metal at the point of departure both before and after actual separation of the coating from the reservoir, the coating thereby having a volume and shape such that its radius of curvature is essentially the same as that of the reservoir at the point of departure, whereby the coating process is carried out at close to equilibrium conditions without appreciable sensitivity to operating parameters pertaining to the coating process, the controlled pressure of the reservoir of molten metal enabling a desired coating volume and shape to be achieved.

2. The process of claim 1 in which said coating is carried out under fluxless conditions.

3. The process of claim 1 in which said coating is carried out under nearly fluxless conditions.

4. The process of claim 1 in which a controlled positive pressure is established and maintained across the surface of the coating of molten metal and said reservoir at said point of departure.

5. The process of claim 1 in which a controlled negative pressure is established and maintained across the surface of the coating of molten metal and said reservoir at said point of departure.

6. The process of claim 1 in which the coating process is a soldering process, said reservoir of molten metal comprises a reservoir of molten solder and said at least one solid metal surface to be coated comprises a solderable metal surface.

7. The process of claim 6 in which the solder coating is carried out under fluxless conditions.

8. The process of claim 6 in which the solder coating is carried out under nearly fluxless conditions.

9. The process of claim 1 in which one solid metal surface to be coated is contacted with said reservoir of molten metal.

10. The process of claim 6 in which at least two solderable metal surfaces are coated to form a joint therebetween.

11. The process of claim 10 in which said controlled pressure is a controlled negative pressure.

12. An improved process in which a molten metal is to be coated onto at least one solid metal surface having a higher melting point than that of said molten metal, comprising:
(a) contacting at least one solid metal surface to be coated with a reservoir of said molten metal, said reservoir comprising a ball of said molten metal, under inert, essentially fluxless conditions, so as to establish a controlled positive pressure across the surface of the coating of molten metal and the surface of said reservoir of molten metal essentially at a desired final pressure of said molten metal coating; and
(b) removing said reservoir from contact with the solid metal surface, a point of departure being formed between the reservoir and the metal coating remaining on the solid metal surface, the positive pressure of the molten metal in the coating being essentially the same as the positive pressure within the reservoir of molten metal at the point of departure both before and after actual separation of the coating form the reservoir, the coating thereby having a volume and shape such that its radius of curvature is essentially the same as that of the reservoir at the point of departure, whereby the coating process is carried out at close to equilibrium conditions without appreciable sensitivity to operating parameters pertaining to the coating process, the controlled pressure of the reservoir of molten metal enabling a desired coating volume and shape to be achieved.

13. The process of claim 12 in which the coating process is a soldering process, said reservoir of molten metal comprises a reservoir of molten solder and said at least one solid metal surface to be coated comprises a solderable metal surface, the reservoir of molten solder comprising a solder ball, the convex radius of curvature of said solder ball providing a controlled positive pressure with said solder ball.

14. The process of claim 13 in which a relatively small solder ball having a small radius of curvature is employed to obtain a thicker solder coating, or a relatively larger solder ball is employed to obtain a thinner coating.

15. The process of claim 13 and including moving a number of solder balls across a circuit board for contact with conductor pads positioned thereon.

16. An improved process in which a molten metal is to be coated onto at least one solid metal surface having a higher melting point than that of said molten metal, comprising:
(a) contacting at least one solid metal surface to be coated with a reservoir of said molten metal, said reservoir comprising a body of said molten metal in a syringe, with a controlled volume and shape of molten metal being deposited therefrom onto the surface of solid metal, under inert, essentially fluxless conditions, so as to establish a controlled positive pressure across the surface of the coating of molten metal and the surface of said reservoir of molten metal essentially at a desired final pressure of said molten metal coating; and
(b) removing said reservoir from contact with the solid metal surface, a point of departure being formed between the reservoir and the metal coating remaining on the solid metal surface, the positive pressure of the molten metal in the coating being essentially the same as the positive pressure within the reservoir of molten metal at the point of departure both before and after actual separation of the coating form the reservoir, the coating thereby having a volume and shape such that its radius of curvature is essentially the same as that of the reservoir at the point of departure, whereby the coating process is carried out at close to equilibrium conditions without appreciable sensitivity to operating parameters pertaining to the coating process, the controlled pressure of the reservoir of molten metal enabling a desired coating volume and shape to be achieved.

17. The process of claim 16 in which a desired controlled positive pressure is placed on the body of the molten metal in said syringe and across the surface of the coating and the reservoir of molten metal at the point of departure.

18. The process of claim 16 in which the force of gravity of the molten metal in the reservoir is used to establish a controlled positive pressure across the coating and the reservoir of molten metal at the point of departure.

19. An improved process in which a molten metal is to be coated onto at least one solid metal surface having a higher molting point than that of said molten metal, comprising:
(a) contacting at least one solid metal surface to be coated with a reservoir of said molten metal, said reservoir comprising a body of molten metal in a syringe, with a controlled volume and shape of molten metal being separated therefrom and retained on the surface of solid metal, under inert, essentially fluxless conditions, so as to establish a controlled negative pressure across the surface of the coating of molten metal and the surface of said reservoir of molten metal essentially at a desired final pressure of said molten metal coating; and
(b) removing said reservoir from contact with the solid metal surface, a point of departure being formed between the reservoir and the metal coating remaining on the solid metal surface, the negative pressure of the molten metal in the coating being essentially the same as the negative pressure within the reservoir of molten metal at the point of departure both before and after actual separation of the coating form the reservoir, the coating thereby having a volume and shape such that its radius of curvature is essentially the same as that of the reservoir at the point of departure, whereby the coating process is carried out at close to equilibrium conditions without appreciable sensitivity to operating parameters pertaining to the coating process, the controlled pressure of the reservoir of molten metal enabling a desired coating volume and shape to be achieved.

20. The process of claim 19 in which the coating of molten metal is applied under a controlled positive pressure, with said controlled negative pressure being applied to said reservoir of molten metal at the point of departure prior to separation of the coating from said reservoir.

21. The process of claim 19 in which a controlled negative pressure is applied to the reservoir of molten metal in the syringe at the time of separation of said molten metal reservoir from said solid metal surface.

22. An improved process in which a molten metal is to be coated onto at least one solid metal surface having a higher melting point than that of said molten metal, comprising:
 (a) contacting at least one solid metal surface to be coated with a reservoir of said molten metal, under inert, essentially fluxless conditions, so as to establish a controlled pressure across the surface of the coating of molten metal essentially at a desired final pressure of said molten metal coating, the coating process being a soldering process, said reservoir of molten metal comprises a reservoir of molten solder and said at least one solid metal surface to be coated comprises a solderable metal surface; and
 (b) removing said reservoir from contact with the solid metal surface, a point of departure being formed between the reservoir and the metal coating remaining on the solid metal surface, the pressure of the molten metal in the coating being essentially the same as the pressure within the reservoir of molten metal at the point of departure both before and after actual separation of the coating form the reservoir, the coating thereby having a volume and shape such that its radius of curvature is essentially the same as that of the reservoir at the point of departure, said solderable surface comprising a base metal conductor pad having a solder coated thereon, oxide and other undesired contaminates being coated on said solder coat, the molten solder ball causing said solder coat to melt, with the oxide and contaminant coating adhering to the solder ball and being stripped from the base metal conductor pad, with a sufficient amount thereof being removed to leave bare oxide free regions on the conductor pad, whereby the coating process is carried out at close to equilibrium conditions without appreciable sensitivity to operating parameters pertaining to the coating process, the controlled pressure of the reservoir of molten metal enabling a desired coating volume and shape to be achieved.

* * * * *